(12) United States Patent
Huang

(10) Patent No.: US 9,161,452 B2
(45) Date of Patent: Oct. 13, 2015

(54) COMPONENT-EMBEDDED PRINTED CIRCUIT BOARD AND METHOD OF FORMING THE SAME

(71) Applicant: MICROCOSM TECHNOLOGY CO., LTD., Tainan (TW)

(72) Inventor: Tang-Chieh Huang, Tainan (TW)

(73) Assignee: Microcosm Technology Co., Ltd., Tainan (TW)

( * ) Notice: Subject to any disclaimer, the term of this patent is extended or adjusted under 35 U.S.C. 154(b) by 12 days.

(21) Appl. No.: 14/302,975

(22) Filed: Jun. 12, 2014

(65) Prior Publication Data
US 2014/0367155 A1    Dec. 18, 2014

(30) Foreign Application Priority Data
Jun. 17, 2013    (TW) .............................. 102121346 A

(51) Int. Cl.
*H05K 1/18* (2006.01)
*H05K 3/46* (2006.01)

(52) U.S. Cl.
CPC .............. *H05K 1/183* (2013.01); *H05K 3/4655* (2013.01); *H05K 3/4697* (2013.01); *H05K 2201/09127* (2013.01); *H05K 2201/10674* (2013.01); *H05K 2203/0264* (2013.01); *H05K 2203/107* (2013.01); *Y10T 29/4913* (2015.01)

(58) Field of Classification Search
USPC ............ 174/260; 361/760, 761, 762; 257/724
See application file for complete search history.

(56) References Cited

U.S. PATENT DOCUMENTS 5,943,216 A * 8/1999 Schmidt ........................ 361/761
8,069,558 B2 * 12/2011 Hirayama et al. ............... 29/832

* cited by examiner

*Primary Examiner* — Andargie M Aychillhum
(74) *Attorney, Agent, or Firm* — McNees Wallace & Nurick LLC

(57) ABSTRACT

A method of forming a component-embedded printed circuit board includes: preparing a first layered structure; preparing a second layered structure that includes an adhesive film and a releasable film; attaching the second layered structure to the first layered structure to form a layered stack, the releasable film releasably covering a mounting region of the first layered structure; heating and pressing the layered stack; cutting the second layered structure through the adhesive film; removing the releasable film together with a portion of the adhesive film from the mounting region to form a hole in the second layered structure; and mounting an electronic component in the hole.

4 Claims, 11 Drawing Sheets

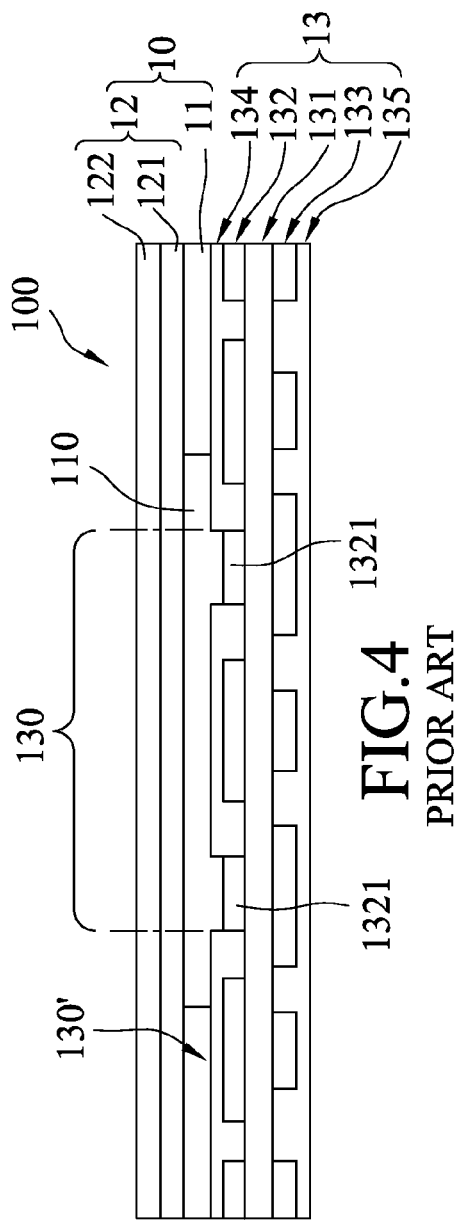
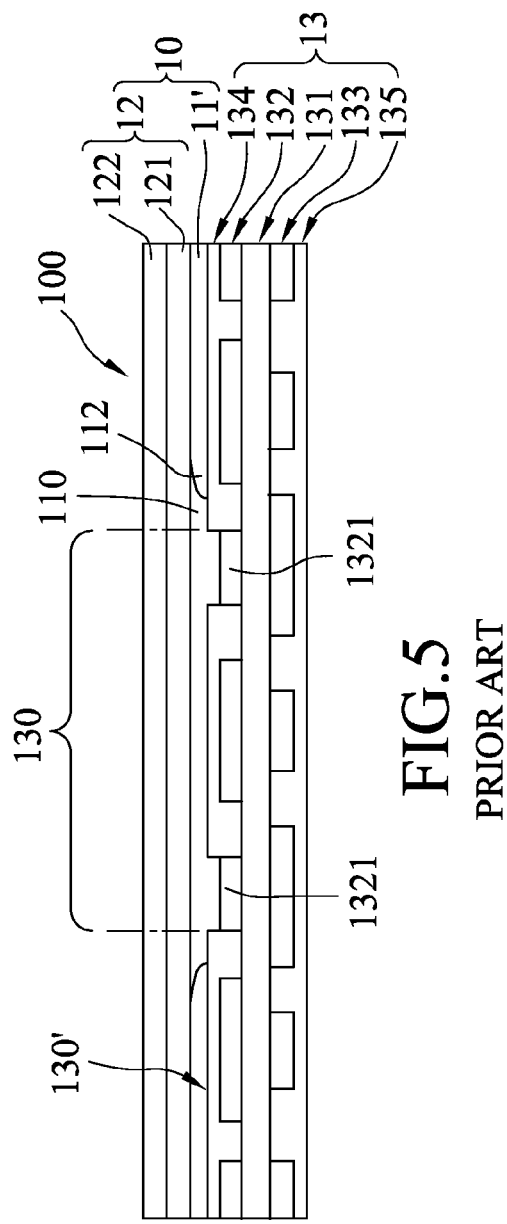
FIG.4 PRIOR ART
FIG.5 PRIOR ART

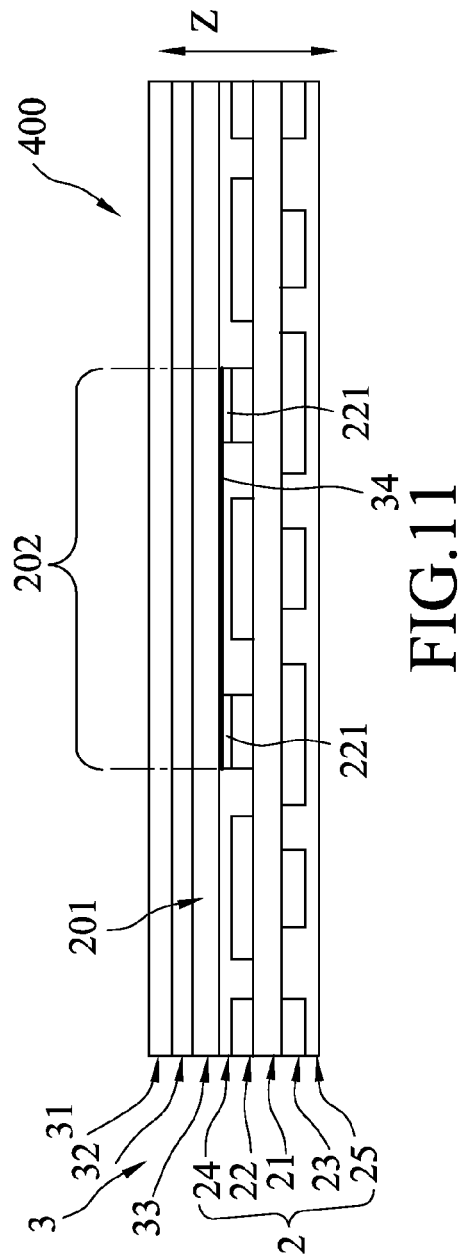
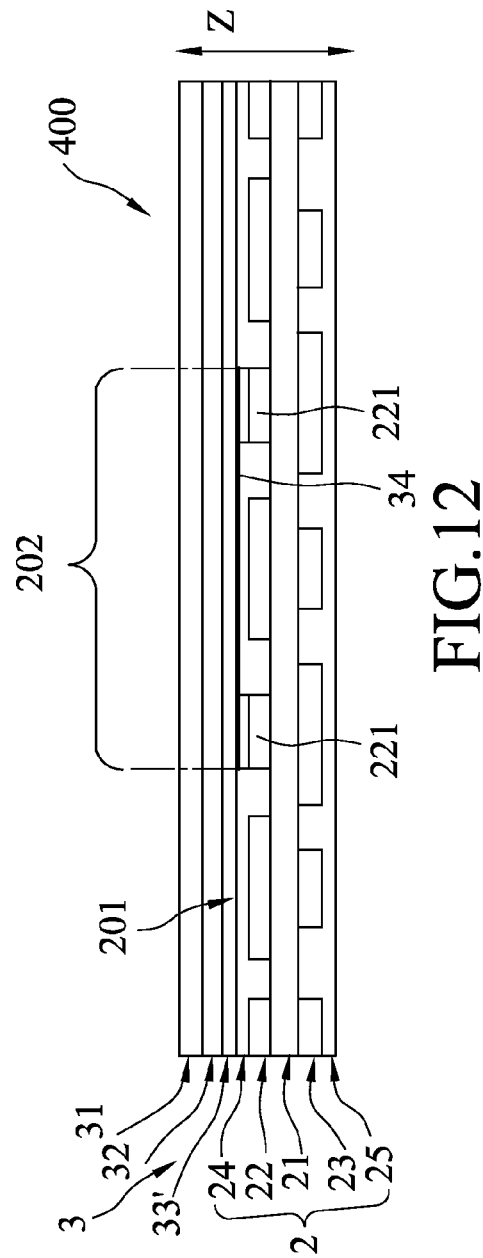

COMPONENT-EMBEDDED PRINTED CIRCUIT BOARD AND METHOD OF FORMING THE SAME

CROSS-REFERENCE TO RELATED APPLICATIONS

This application claims priority of Taiwanese Patent Application No.102121346, filed on Jun. 17, 2013.

BACKGROUND OF THE INVENTION

1. Field of the Invention

This invention relates to a component-embedded printed circuit board and a method of forming the same, more particularly to a method involving the use of a releasable film in the process of forming a component-embedding hole in a layered structure of a printed circuit board.

2. Description of the Related Art

FIGS. 1 to 9 illustrate consecutive steps of a conventional method of forming a component-embedded printed circuit board. The conventional method includes the steps of: preparing a copper clad laminate (CCL) 13 that has a core insulator layer 131, a patterned upper foil layer 132 formed on one side of the core insulator layer 131, an upper protection layer 134 of an insulation material covering the upper foil layer 132, a patterned lower foil layer 133 formed on an opposite side of the core insulator layer 131, and a lower protection layer 135 of the insulation material covering the lower foil layer 133 (see FIG. 1), the copper clad laminate 13 having a mounting region 130 with an area substantially equal to a cross-sectional area of an electronic component 18 to be mounted on the mounting region 130 in a subsequent step (see FIG. 8), the upper foil layer 132 having a plurality of spaced apart foil traces 1321, two of the foil traces 1321 being disposed at the mounting region 130 and being exposed from the upper protection layer 134, the copper clad laminate 13 further having a build-up region 130' surrounding the mounting region 130; preparing a thermosetting adhesive film 11 (see FIG. 2) that is solid at room temperature and that can be softened and cured at an elevated temperature ranging from 150° C. to 220° C.; punching the thermosetting adhesive film 11 under room temperature to form a through-hole 110 therein (see FIG. 2); preparing a resin coated copper (RCC) foil 12 that has a build-up insulator layer 121 and a copper foil layer 122 formed on the build-up insulator layer 121 (see FIG. 3); attaching the punched thermosetting adhesive film 11 to the resin coated copper foil 12 to form a build-up layered structure 10 (see FIG. 3); stacking the build-up layered structure 10 on the copper clad laminate 13 along a stacking direction to form a printed circuit stack 100, such that the through-hole 110 is aligned with the mounting region 130 in the stacking direction (see FIG. 4); heating and pressing the printed circuit stack 100 (see FIG. 5) so as to form the punched thermosetting adhesive film 11 into a cured thermoset film 11' that adhesively bonds the build-up insulator layer 121 to the build-up region 130' of the copper clad laminate 13; patterning the copper foil layer 122 to form a plurality of copper traces 1221 on the build-up insulator layer 121 (see FIG. 6); cutting the build-up layered structure 10 through the build-up insulator layer 121 along a cutting path that is aligned with a periphery of the mounting region 130 using a laser beam 150 (see FIG. 7); removing a cut portion of the build-up insulator layer 121 so as to form a component-embedding hole 101 in the build-up layered structure 10 to expose the mounting region 130 (see FIG. 8); and disposing the electronic component 18 in the component-embedding hole 101 and mounting the electronic component 18 on the mounting region 130 to connect electrically with the two foil traces 1321 at the mounting region 130 via a solder material 19 using conventional soldering techniques (see FIG. 9).

It is noted that the thermosetting adhesive film 11 is required to be punched to form the through-hole 110 before the heating and pressing of the printed circuit stack 100. Otherwise, the cured thermoset adhesive film 11' may be adhesively bonded to the mounting region 130 after the heating and pressing of the printed circuit stack 100 and may not be removed from the mounting region 130 by peeling.

Since the thermosetting adhesive film 11 is softened and is slightly flowable during the heating and pressing operation, an area thereof expands and a thickness thereof becomes thinner after the heating and pressing operation. Hence, because of the expansion, the through-hole 110 in the thermosetting adhesive film 11 is required to have an area that is much greater than that of the mounting region 130, so that the thermosetting adhesive film 11 is prevented from overflowing into the mounting region 130 and cover the two foil traces 1321 at the mounting region 130 during heating and pressing of the thermosetting adhesive film 11. As a consequence, the cured thermoset adhesive film 11' thus formed may have a curved portion 112 around the through-hole 110, the curved portion 112 having a cross-section with a gradually decreasing thickness (T) (see FIG. 9). The curved portion 112 cooperates with the build-up insulator layer 121 to define a cavity 17 therebetween. As such, residue of an acid solution tends to be trapped in the cavity 17 during subsequent acid washing operations, which can result in chemical attack on the bonding between the build-up insulator layer 121 and the cured thermoset adhesive film 11' and corrosion to the electronic component 18 and the two foil traces 1321 at the mounting region 130. In addition, a portion 1211 of the build-up insulator layer 121 that is disposed around the component-embedding hole 101 and adjacent to the curved portion 112 is susceptible to mechanical attack during subsequent mounting and soldering operations, which can result in an adverse effect on the performance of the electronic component 18.

SUMMARY OF THE INVENTION

Therefore, an object of the present invention is to provide a method of forming a component-embedded printed circuit board that can overcome the aforesaid drawbacks associated with the prior art.

Another object of this invention is to provide a component-embedded printed circuit board that can overcome the aforesaid drawbacks associated with the prior art.

According to one aspect of this invention, there is provided a method of forming a component-embedded printed circuit board. The method comprises: preparing a first layered structure that includes a first insulator layer and a patterned first metal-foil layer that is disposed on the first insulator layer and that has a plurality of spaced apart first foil traces, the first layered structure having a mounting side that has a build-up region and at least one mounting region, at least one of the first foil traces being disposed at the mounting region; preparing a second layered structure that includes a second metal-foil layer, a second insulator layer, an adhesive film of a thermosetting material, and a releasable film, which are stacked one above another in the above order; attaching the second layered structure to the first layered structure to form a build-up layered stack, the adhesive film contacting and covering the build-up region of the first layered structure, the releasable film releasably contacting and covering the mounting region of the first layered structure; heating and pressing the build-up layered stack, such that the adhesive film is formed into a cured thermoset adhesive film that adhesively bonds the build-up region of the first layered structure and the second layered structure; cutting the second layered structure through the second insulator layer and the cured thermoset adhesive film along a cutting path, which is registered with a periphery of the releasable film, after the heating and pressing; removing the releasable film together with a cut portion of the second insulator layer and a cut portion of the cured thermoset adhesive film, that are stacked on the releasable film, from the mounting region of the mounting side of the first layered structure after the cutting so as to form a component-embedding hole in the second layered structure to expose the mounting region; and disposing an electronic component in the component-embedding hole.

According to another aspect of this invention, there is provided a component-embedded printed circuit board that comprises: a first layered structure that includes a first insulator layer and a patterned first metal-foil layer that is formed on the first insulator layer and that has a plurality of spaced apart first foil traces, the first layered structure having a mounting side that has a build-up region and at least one mounting region, at least one of the first foil traces being disposed at the mounting region; a second layered structure that is adhesively bonded to the first layered structure and that includes a second metal-foil layer, a second insulator layer and a thermoset adhesive film, which are stacked one above another in the above order, the thermoset adhesive film being adhesively bonded to the second insulator layer and the build-up region of the mounting side of the first layered structure, the second layered structure being formed with a component-embedding hole that extends through the second insulator and the thermoset adhesive film to expose the mounting region of the mounting side of the first layered structure, the component-embedding hole being defined by a hole-defining surface that has top and bottom open ends and that extends entirely in a continuously downward direction from the top open end to the bottom open end, the second insulator layer having a hole-defining face that has an endless bottom peripheral edge, the thermoset adhesive film having a hole-defining face that has an endless top peripheral edge, the hole-defining face of the thermoset adhesive film cooperating with the hole-defining face of the second insulator layer to form the hole-defining surface that defines the component-embedding hole, the top peripheral edge entirely overlapping and contacting the bottom peripheral edge; and an electronic component fitted in the component-embedding hole.

BRIEF DESCRIPTION OF THE DRAWINGS

Other features and advantages of the present invention will become apparent in the following detailed description of the preferred embodiment of this invention, with reference to the accompanying drawings, in which:

FIGS. 1 to 9 are schematic views to illustrate consecutive steps of a conventional method of forming a component-embedded printed circuit board; and FIGS. 10 to 16 are schematic views to illustrate consecutive steps of the preferred embodiment of a method of forming a component-embedded printed circuit board according to the present invention.

DETAILED DESCRIPTION OF THE PREFERRED EMBODIMENT

Figure 1:
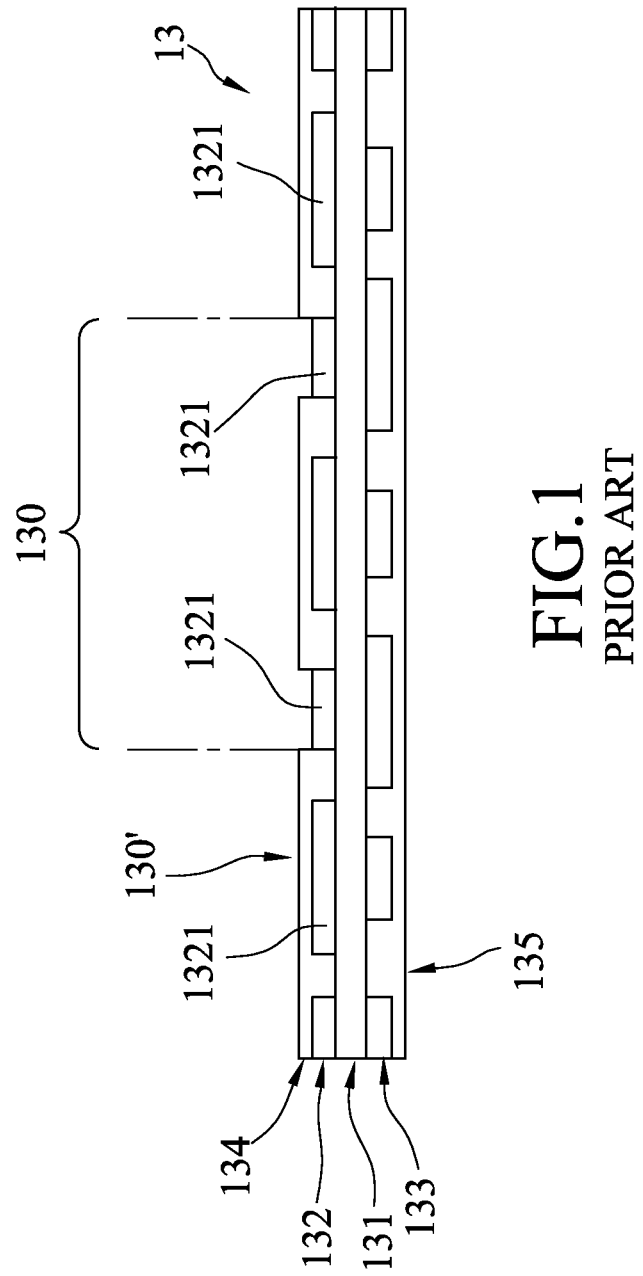
Figure 2:
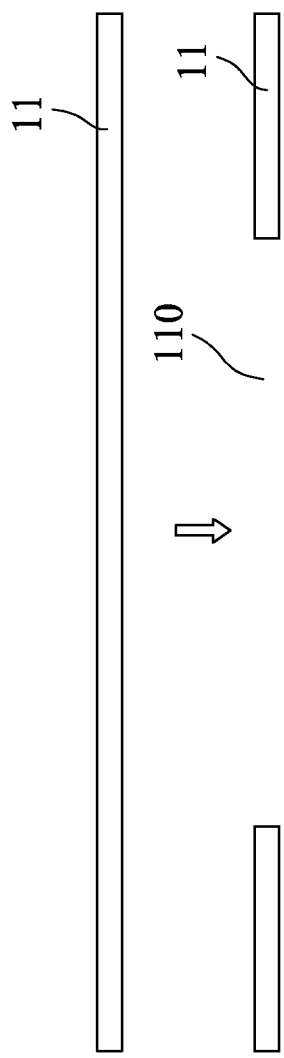
Figure 3:
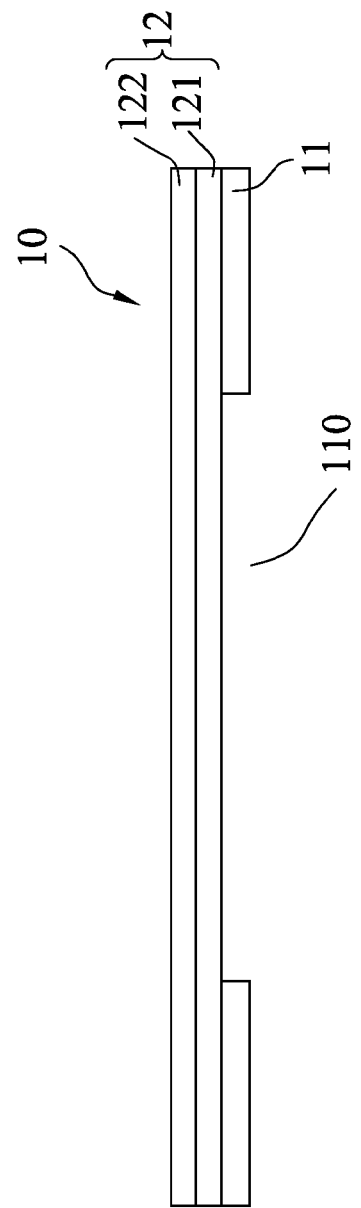
Figure 6:
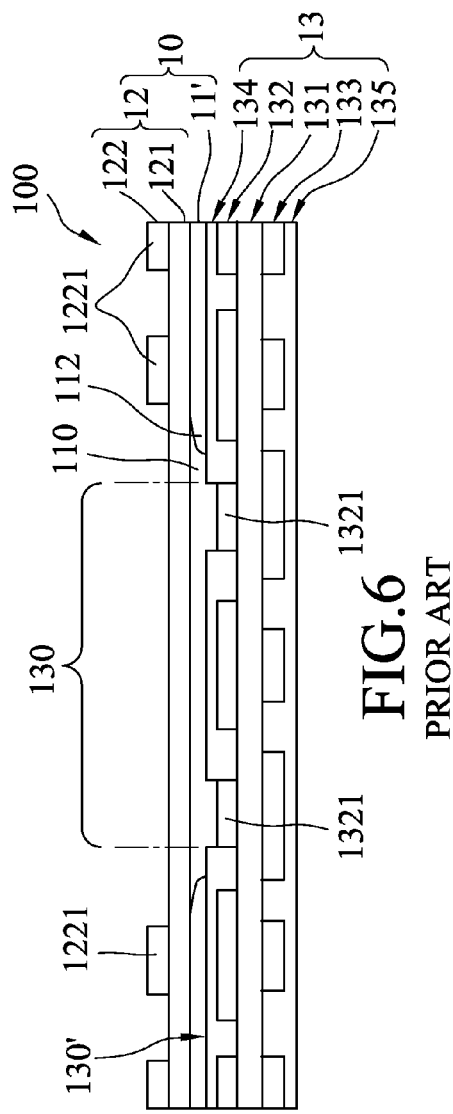
Figure 7:
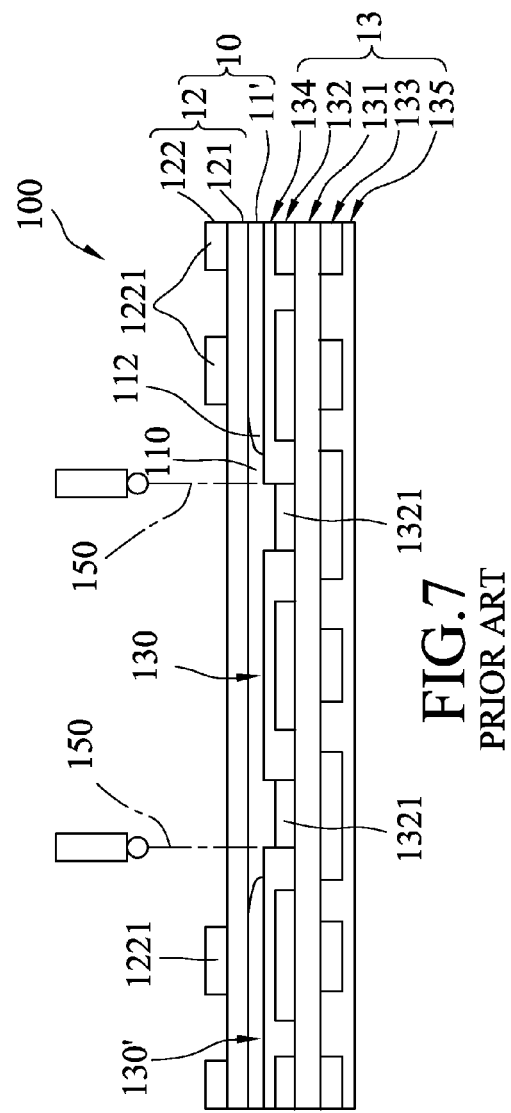
Figure 8:
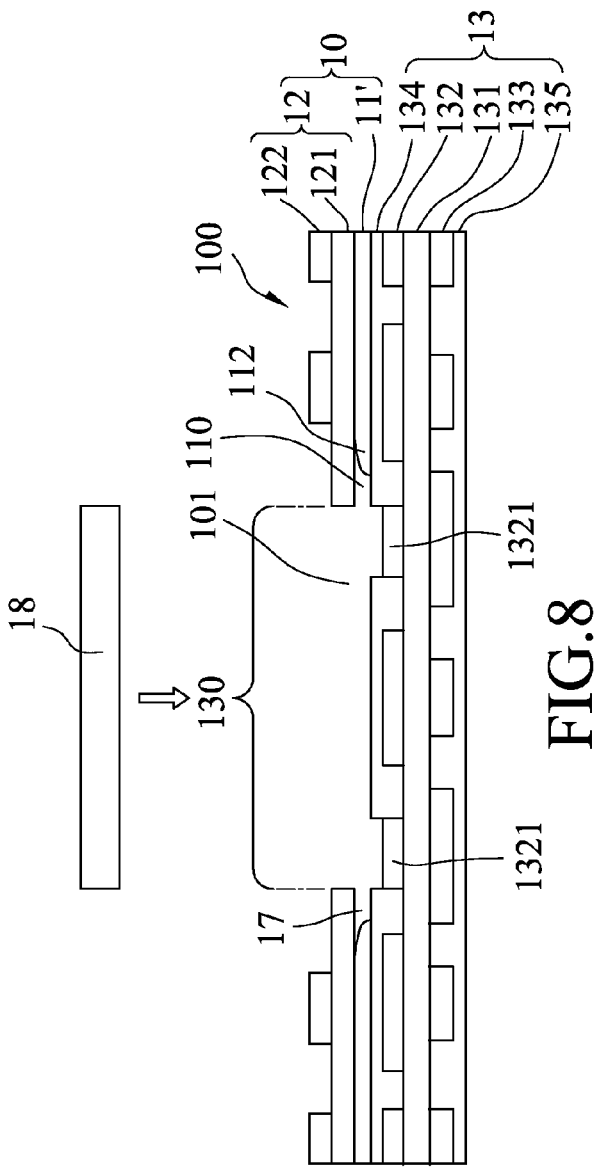
Figure 9:
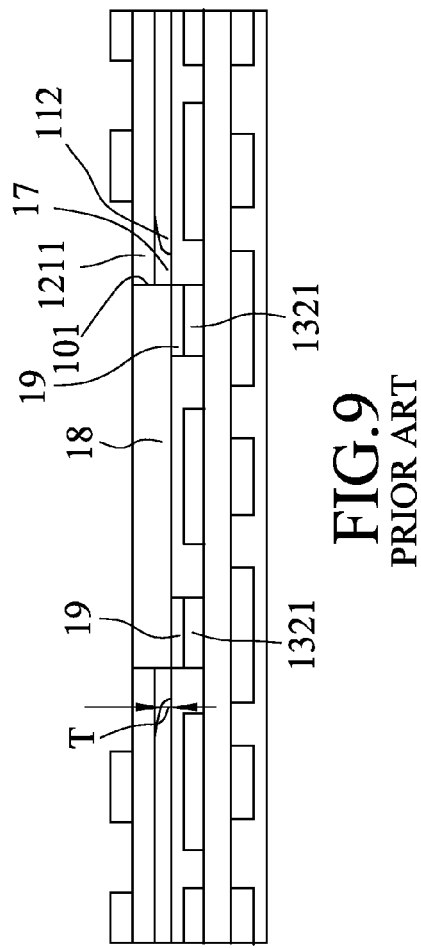
Figure 10:
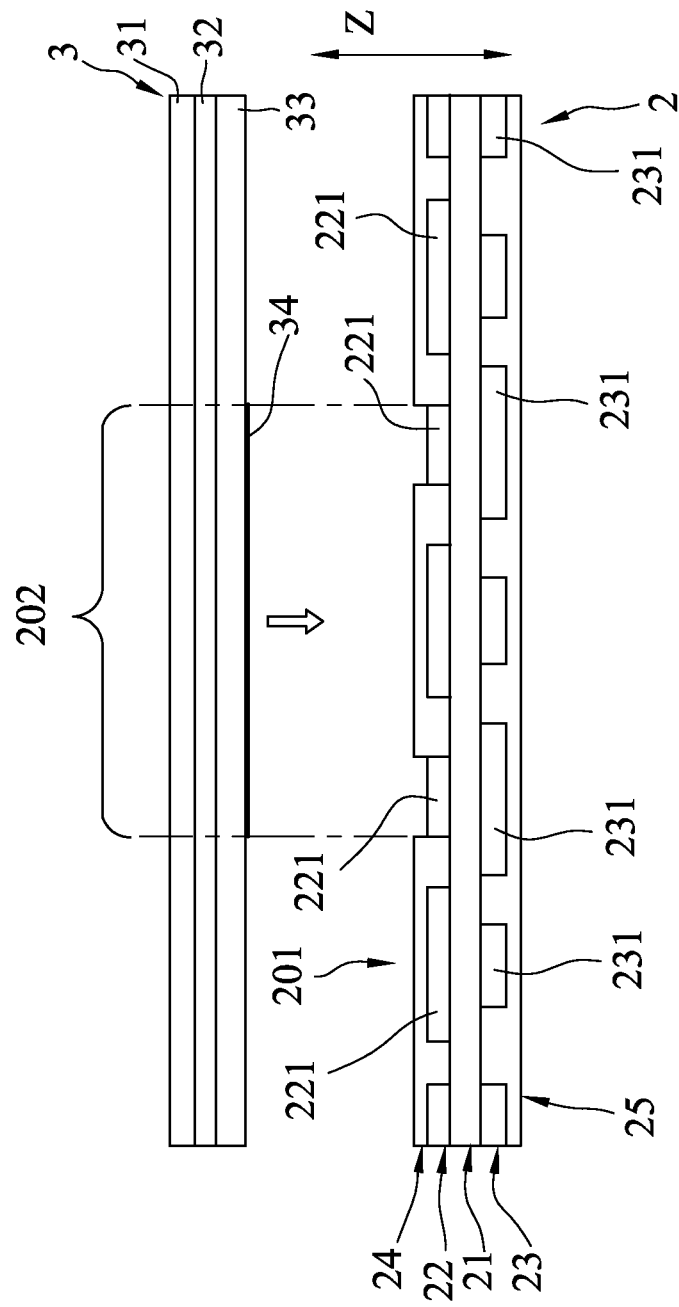
Figure 13:
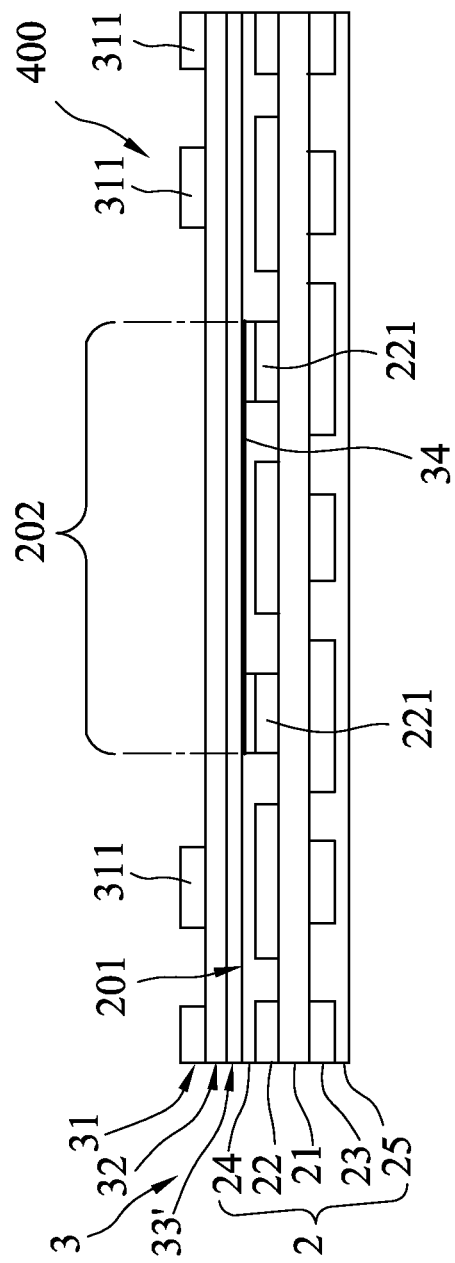
Figure 14:
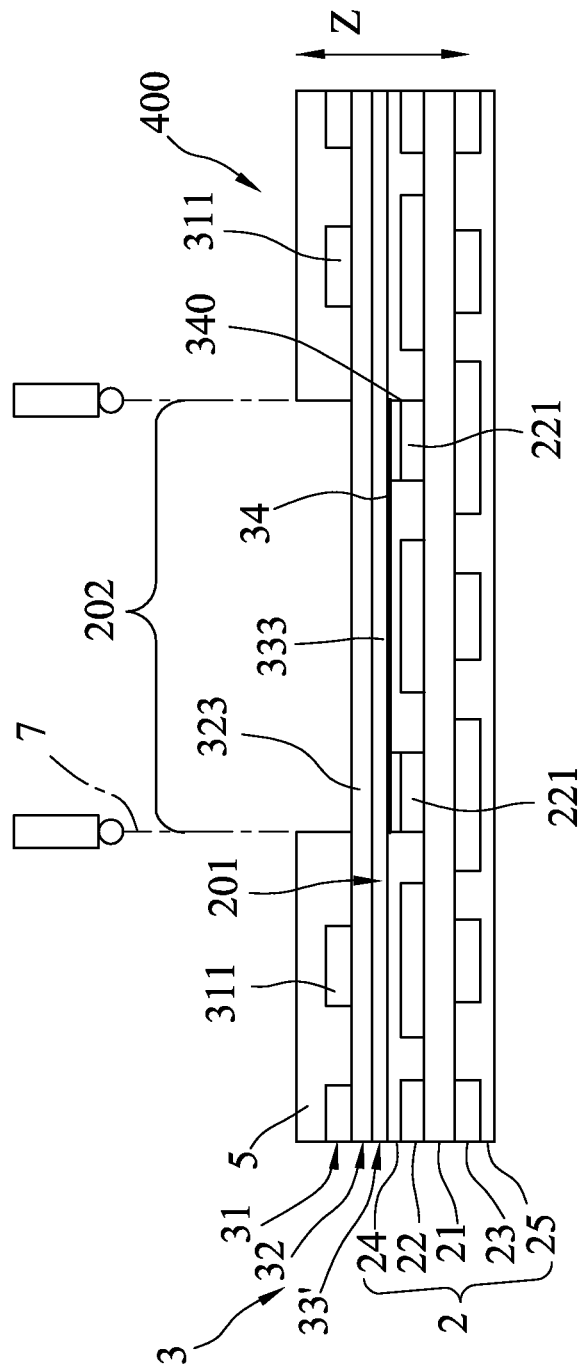
Figure 15:
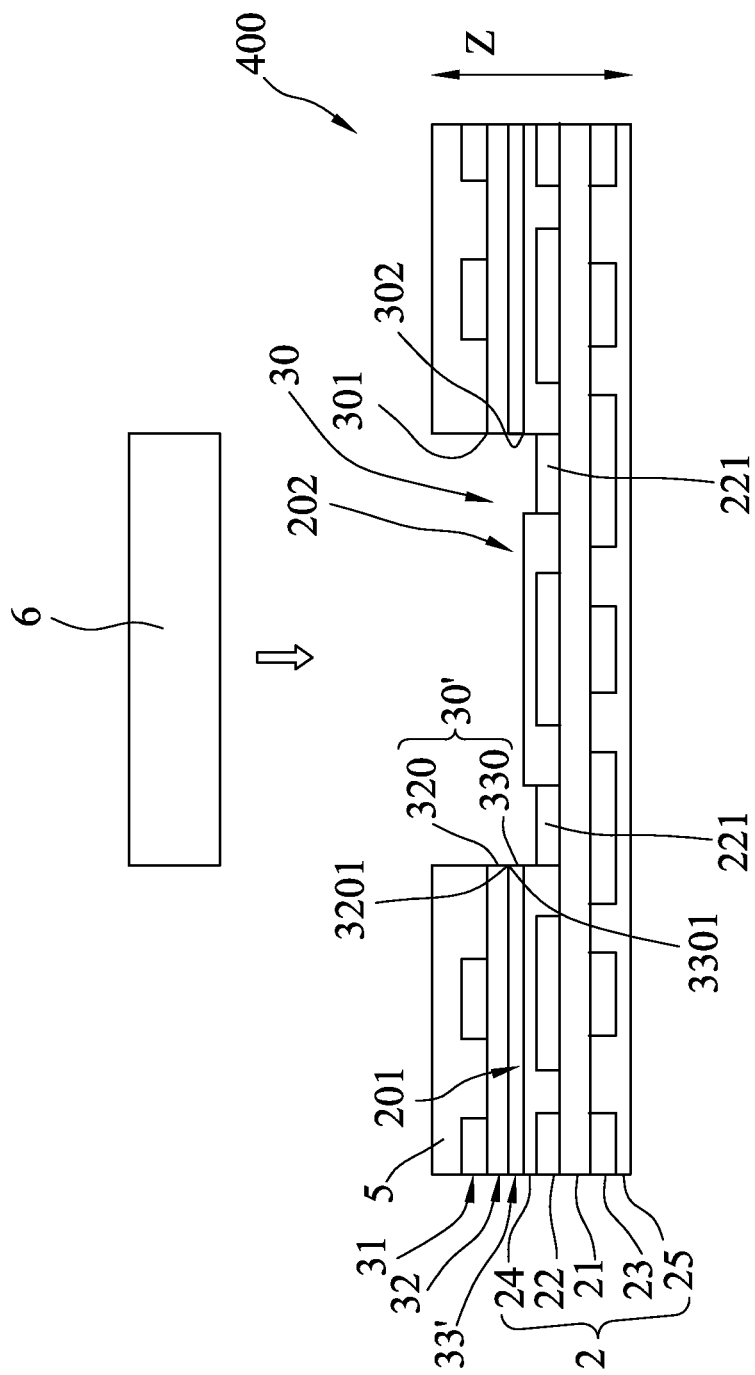
Figure 16:
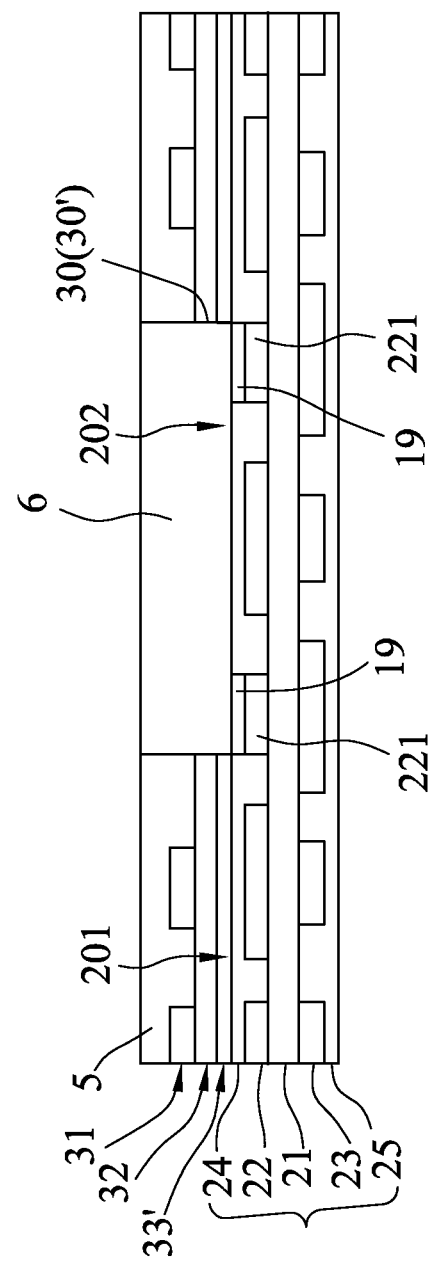

FIGS. 10 to 16 illustrate the preferred embodiment of a method of forming a component-embedded printed circuit board according to this invention.

The method includes the steps of: preparing a first layered structure 2 (which is a copper clad laminate (CCL) in this embodiment) that includes a first insulator layer 21 and a patterned first metal-foil layer 22 that is disposed on one side of the first insulator layer 21 and that has a plurality of spaced apart first foil traces 221 (see FIG. 10), the first layered structure 2 having a mounting side that has a build-up region 201 and at least one mounting region 202 which is surrounded by the build-up region 201, at least one of the first foil traces 221 being disposed at the mounting region 202, the first layered structure 2 further including a base metal-foil layer 23 that is formed on an opposite side of the first insulator layer 21 and that has a plurality of spaced apart base foil traces 231, a patterned first protection layer 24 of an insulator material that covers the first foil traces 221, and a patterned second protection layer 25 of an insulator material that covers the base foil traces 231 apart from one another; preparing a second layered structure 3 that includes a second metal-foil layer 31, a second insulator layer 32, an adhesive film 33 of a thermosetting material, and a releasable film 34, which are stacked one above another in the above order along a stacking direction (Z) (see FIG. 10), the releasable film 34 having an area substantially equal to that of the mounting region 202; attaching the second layered structure 3 to the first layered structure 2 to form a build-up layered stack 400 (see FIG. 11), the first and second layered structures 2, 3 being stacked one above the other along the stacking direction (Z), the adhesive film 33 contacting and covering the build-up region 201 of the first layered structure 2, the releasable film 34 releasably contacting and covering the mounting region 202 of the first layered structure 2; heating and pressing the build-up layered stack 400, such that the adhesive film 33 is thermosetted into a cured thermoset adhesive film 33' (see FIG. 12) that adhesively bonds the build-up region 201 of the first layered structure 2 and the second insulator layer 32 of the second layered structure 3 and that the releasable film 34 remains in releasable or peelable contact with the mounting region 202 of the first layered structure 2; patterning the second metal-foil layer 31 to form a plurality of spaced apart second foil traces 311 (see FIG. 13); forming a patterned third protection layer 5 of an insulator material that covers the second foil traces 311 (see FIG. 14); cutting the second layered structure 3 through the second insulator layer 32 and the cured thermoset adhesive film 33' along a cutting path, which is substantially registered with a periphery 340 of the releasable film 34 along the stacking direction (Z), after the heating and pressing (see FIG. 14), the cutting being conducted by laser techniques with a laser beam 7; removing the releasable film 34 together with a cut portion 323 of the second insulator layer 32 and a cut portion 333 of the cured thermoset adhesive film 33' (see FIG. 14), that are stacked on the releasable film 34, from the mounting region 202 of the mounting side of the first layered structure 2 after the cutting so as to form a component-embedding hole 30 in the second layered structure 3 (see FIG. 15) that extends through the second insulator layer 32 and the cured thermoset adhesive film 33' to expose the mounting region 202; and disposing and fitting an electronic component 6 in the component-embedding hole 30 to electrically connect the electronic component 6 with said at least one of the first foil traces 221 via a solder material 19 using conventional soldering techniques.

In this embodiment, the releasable film 34 is made from a curable ink, and is printed and cured on the adhesive film 33 before the attachment of the second layered structure 3 to the first layered structure 2.

Preferably, the curable ink contains a curable resin selected from the group consisting of photo curable resins and thermal curable resins.

Preferably, at least one of the first insulator layer 21 and the second insulator layer 32 is made from a material selected from the group consisting of epoxy resins, phenolic resins, polyimide, and polyester.

Preferably, the thermosetting material is selected from the group consisting of epoxy resin-based adhesives, polyester-based adhesive, and acrylic-based adhesive.

The component-embedding hole 30 is defined by a hole-defining surface 30' (see FIG. 15) that has top and bottom open ends 301, 302 and that extends entirely in a continuously downward direction from the top open end 301 to the bottom open end 302. In this embodiment, the continuously downward direction is parallel or substantially parallel to the stacking direction (Z). The second insulator layer 32 has a hole-defining face 320 that has an endless bottom peripheral edge 3201. The cured thermoset adhesive film 33' has a hole-defining face 330 that has an endless top peripheral edge 3301. The hole-defining face 330 of the thermosetted adhesive film 33' and the hole-defining face 320 of the second insulator layer 32 cooperatively form the hole-defining surface 30' that defines the component-embedding hole 30. Each of the hole-defining face 330 of the cured thermoset adhesive film 33' and the hole-defining face 320 of the second insulator layer 32 extends entirely in a direction substantially parallel to the stacking direction (Z), and the top peripheral edge 3301 entirely overlaps and contacts the bottom peripheral edge 3201. Hence, no cavity is formed in a laminated boundary between the second insulator layer 32 and the cured thermoset adhesive film 33' after formation of the component-embedding hole 30.

In this embodiment, the component-embedding hole 30 is rectangular in shape. Alternatively, the component-embedding hole 30 may be cylindrical in shape or may have other shapes.

With the inclusion of the releasable film 34 in the second layered structure 3 that is laminated with the first layered structure 2 according to the method of this invention, the aforesaid drawbacks associated with the prior art can be eliminated.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A component-embedded printed circuit board comprising:
    a first layered structure that includes a first insulator layer and a patterned first metal-foil layer that is formed on said first insulator layer and that has a plurality of spaced apart first foil traces, said first layered structure having a mounting side that has a build-up region and at least one mounting region, at least one of said first foil traces being disposed at said mounting region;
    a second layered structure that is adhesively bonded to said first layered structure and that includes a second metal-foil layer, a second insulator layer and a thermoset adhesive film, which are stacked one above another in the above order, said thermoset adhesive film being adhesively bonded to said second insulator layer and said build-up region of said mounting side of said first layered structure, said second layered structure being formed with a component-embedding hole that extends through said second insulator and said thermoset adhesive film to expose said mounting region of said mounting side of said first layered structure, said component-embedding hole being defined by a hole-defining surface that has top and bottom open ends and that extends entirely in a continuously downward direction from said top open end to said bottom open end, said second insulator layer having a hole-defining face that has an endless bottom peripheral edge, said thermoset adhesive film having a hole-defining face that has an endless top peripheral edge, said hole-defining face of said thermoset adhesive film cooperating with said hole-defining face of said second insulator layer to form said hole-defining surface that defines said component-embedding hole, said top peripheral edge entirely overlapping and contacting said bottom peripheral edge; and
    an electronic component fitted in said component-embedding hole.

2. The component-embedded printed circuit board of claim 1, wherein said thermoset adhesive film is made from a thermosetting material selected from the group consisting of epoxy resin-based adhesives, polyester-based adhesive, and acrylic-based adhesive.

3. The component-embedded printed circuit board of claim 1, wherein said second metal-foil layer is patterned and has a plurality of spaced apart second foil traces .

4. The component-embedded printed circuit board of claim 1, wherein said first and second layered structures are stacked one above the other along a stacking direction, said continuously downward direction being substantially parallel to said stacking direction.

\* \* \* \* \*